United States Patent [19]

Hagiwara et al.

[11] 4,443,718

[45] Apr. 17, 1984

[54] NONVOLATILE SEMICONDUCTOR MEMORY WITH STABILIZED LEVEL SHIFT CIRCUIT

[75] Inventors: Takaaki Hagiwara, Kodaira; Yuji Yatsuda, Hachioji, both of Japan

[73] Assignee: Hitachi, Ltd., Tokyo, Japan

[21] Appl. No.: 188,740

[22] Filed: Sep. 19, 1980

[30] Foreign Application Priority Data

Sep. 21, 1979 [JP] Japan .............................. 54-120639

[51] Int. Cl.³ .................... G11C 17/00; G11C 7/06; G11C 11/40
[52] U.S. Cl. .................................. 307/530; 365/104; 365/184; 365/185
[58] Field of Search ...................... 307/449, 463, 530; 365/103, 104, 184, 185, 189

[56] References Cited

U.S. PATENT DOCUMENTS

| 3,938,108 | 2/1976 | Salsbury et al. ................. 365/104 |
| 4,082,966 | 4/1978 | Lou .................................... 307/530 |
| 4,179,626 | 12/1979 | Oehler .............................. 307/530 |
| 4,223,394 | 9/1980 | Pathak et al. ................. 307/530 X |
| 4,266,283 | 5/1981 | Perlegos et al. ............... 365/104 |
| 4,287,570 | 9/1981 | Stark ................................. 365/104 |

FOREIGN PATENT DOCUMENTS 53-69551 6/1978 Japan .................................. 365/104

OTHER PUBLICATIONS

Kitano et al., "A 4-Mbit Full-Wafer Rom", *IEEE Trans. on Electron Devices*, vol. Ed-27, No. 8; 8/1980; pp. 1621-1628.

Wilson, "Cell Layout Boosts Speed of Low-Power 64K Rom", *Electronics;* pp. 96-99; 3/30/78.

Haug et al., "Programmable Read-Only Memory"; *IBM Tech. Discl. Bull.*, vol. 18, No. 2, pp. 445-446; 7/1975.

*Primary Examiner*—Larry N. Anagnos
*Attorney, Agent, or Firm*—Antonelli, Terry & Wands

[57] ABSTRACT

A nonvolatile semiconductor memory including a memory matrix having a plurality of memory cells with nonvolatile memory elements and arranged in the form of a matrix, a selecting circuit for selecting a desired memory cell from the memory matrix, and a read-out circuit for reading out the information stored in the selected memory cell. The read-out circuit includes a sense amplifier and an output buffer. The sensed amplifier includes an inverter having a load element to which a supply voltage is applied and a selected memory cell acting as a driver element. The output buffer includes a level shift circuit for shifting the level of an output signal voltage from the sense amplifier with the level shift circuit including a stabilizing circuit for stabilizing the level of the shifted signal voltage during fluctuations in the supply voltage. An output driver circuit is provided for receiving the shifted signal voltage from the level shift circuit.

9 Claims, 11 Drawing Figures

NONVOLATILE SEMICONDUCTOR MEMORY WITH STABILIZED LEVEL SHIFT CIRCUIT

BACKGROUND OF THE INVENTION

The present invention relates to a read only memory (which will be shortly referred to as "ROM"), and particularly to a read-out circuit thereof. More particularly, the present invention relates to a memory equipped with a read-out circuit of the type, in which the memorized data of the memory cell of the ROM are read out by detecting whether or not any current flows through that memory cell.

A ROM is divided into (1) an ultraviolet light erasable ROM (which will be shortly referred to as "EPROM": Erasable Programmable ROM), (2) an electrically alterable ROM (which will be shortly referred to as "EAROM": Electrically Alterable ROM), and (3) a PROM (Programmable ROM) such as a fuse ROM or a mask ROM (Mask Programmable ROM).

In a known EAROM, for example, MNOS (structure) type insulated-gate field effect transistors (which will be shortly referred to as "MNOS Tr.") are arranged in the form of a matrix. In this MNOS Tr., electrons and holes are injected by the tunnel effect into the trap at the interface between two kinds of insulating layers (i.e., an $Si_3N_4$ layer and an $SiO_2$ layer) through an $SiO_2$ layer which is made thinner than the Si side. The MNOS Tr. according to the prior art is shown in section in FIG. 1. In this Figure: reference numeral 11 indicates a silicon (Si) substrate of N-type conductivity; numerals 12 and 13 indicate diffusion layers of $P^+$-type conductivity forming the source and drain regions; numeral 14 indicates an $SiO_2$ layer; numeral 15 indicates an $Si_3N_4$ layer; and numeral 16 indicates a gate electrode. By applying a positive writing voltage (about +25 V) to the gate electrode of the MNOS Tr. having the construction thus far described, the electrons are injected into the trap by the tunnel effect so that the threshold voltage of the MNOS Tr. can be lowered (e.g., to about +1 V) to establish the written state (i.e., the conductive state of the MNOS Tr., which will be shortly referred to as "1" state). In order to eliminate this trap of the electrons, the inverse operations are effected by impressing a negative erasing voltage (at about −25 V) upon the gate electrode so that the threshold voltage of the MNOS Tr. can be raised (e.g., to about −8 V) to establish the erased state (i.e., the nonconductive state of the MNOS Tr., which will be shortly referred to as "0" state). In order to detect the difference between the two "0" and "1" states, a reading voltage at about −6 V is impressed upon the gate electrode of the MNOS Tr. so that whether or not any current flows between the source and drain can be sensed.

In a known EPROM, on the other hand, floating-gate type insulated-gate field effect transistors (which will be shortly referred to as "FAMOS Tr.") are arranged in the form of a matrix. A representative of this FAMOS Tr. is shown in FIG. 2. In this Figure: numeral 21 indicates an N type Si substrate; numerals 22 and 23 indicate $P^+$-type diffusion layers forming the source and drain regions; numeral 24 indicates an $SiO_2$ layer; and numeral 25 indicates a floating gate made of polycrystalline Si. In the FAMOS Tr. having the construction thus far described, electrons are injected into the floating gate by effecting the avalanche effect phenomena between the drain and the substrate when a high voltage is impressed between the source and drain so that the writing operation in the "1" state can be effected. In case the reading operation is to be effected, a conductive state is established between the source and drain, when a voltage is impressed inbetween, because an inversion layer is formed inbetween if the floating gate is negatively charged. In other words, the "0" and "1" states can be judged in accordance with whether the floating gate is negatively charged. The erasure of stored information is accomplished by the exposure of an ultraviolet light to discharge the electrons from the floating gate.

Although the foregoing description is directed to the EAROM and EPROM by way of example, a variety of other ROMs are known in the art.

The aforementioned MNOS Tr. and FAMOS Tr. are exemplified by a P channel type element but can naturally be exemplified by an N channel type element (although the polarity of the voltage to be impressed is inverted).

A read-out circuit having such characterisitics as are suitable for the ROMs thus far described is desired.

SUMMARY OF THE INVENTION

In order to stabilize the read-out circuit of the ROMs for the fluctuations in the supply voltage, the present invention is featured by the following points:

(1) A variable load resistance source follower is connected at the next step of a sense amplifier to effect stabilization for the fluctuations in the supply voltage; and (2) For the sense amplifier itself, a switching MOS Tr. and a pull-up MOS Tr. have their gate voltages stabilized.

DESCRIPTION OF THE PREFERRED EMBODIMENTS

Figure 1:
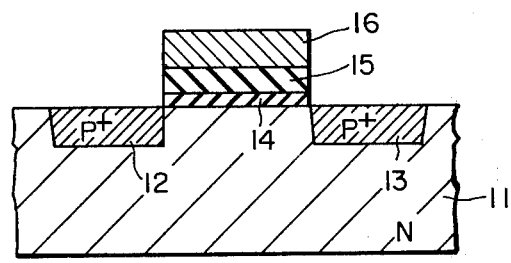
FIG. 1 is a sectional view illustrating an MNOS Tr.
Figure 2:
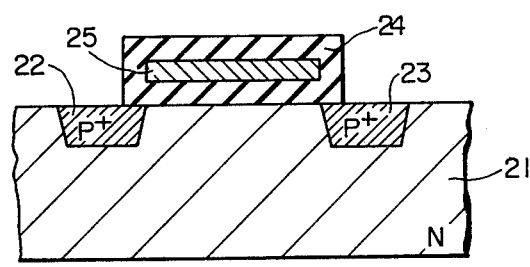
FIG. 2 is a sectional view illustrating an FAMOS Tr.
Figure 3:
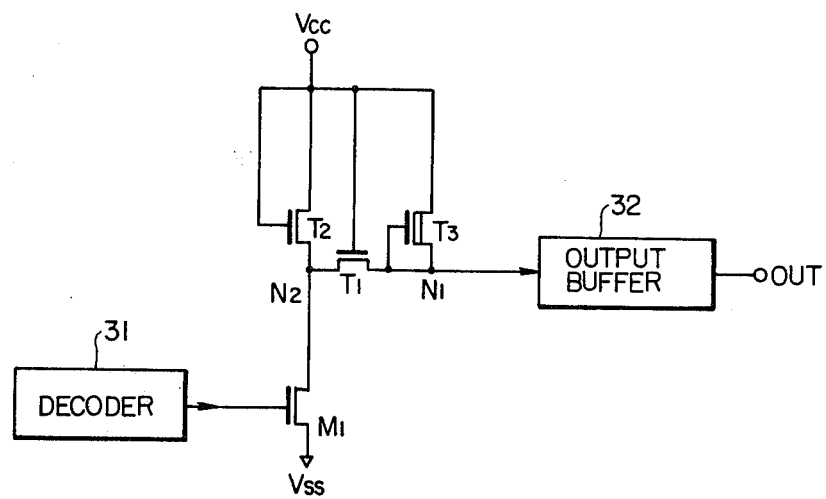
FIG. 3 is a simplified circuit diagram showing an ROM read-out circuit.

A read-out circuit for the ROMs is shown in FIG. 3.
The following description is limited to the case, in which the ROMs are composed of N channel elements and in which a reading supply voltage $V_{cc}$ is at 5 V whereas a voltage $V_{ss}$ is at a grounded level. In FIG. 3, reference numeral 31 indicates a decoder; numeral 32 indicates an output buffer; letters $T_1$ and $T_2$ indicate enhancement mode insulated-gate field effect transistors of N channel type (which has a threshold voltge, e.g., at 2.5 V); and letter $T_3$ indicates a depletion mode insulated-gate field effect transistor of N channel type (which has a threshold voltage, e.g., −3 V). A sense amplifier is fundamentally an inverter circuit which uses an element $M_1$ (e.g., MNOS Tr.) of a memory cell as a driver and an insulated-gate transistor $T_3$ (which will be shortly referred to as "MOS Tr.") as a load. However, since a mere inverter cannot accomplish the high speed operation due to the large stray capacitance of a data line (corresponding to a node $N_2$ in the Figure), the following modification is added. First of all, the enhancement mode switching MOS Tr. $T_1$ is introduced to separate the node $N_2$ from a node $N_1$. More specifically, if the MOS Tr. $T_3$ charges up the nodes $N_1$ and $N_2$ until the latter node $N_2$ is charged to a preset voltage, the MOS Tr. $T_1$ is cut off, and thereafter it is sufficient to charge only the node $N_1$ so that the charging rate can be raised. As a result, when the memory cell is at its nonconductive state, the node $N_1$ reaches the voltage level of 5 V at a relatively high rate. On the contrary, when the memory cell is at its conductive state, the potentials of the nodes $N_1$ and $N_2$ take such levels as are determined by the sizes of the enhancement mode MOS Tr. $T_1$ and the transistor $M_1$ constituting the memory cell and by the gate voltage. At this time, the charges stored at the nodes $N_1$ and $N_2$ are extracted through the transistor $M_1$ of the memory cell. For this operation, it is sufficient to slightly (about 0.3 V) vary the potential at the node $N_2$ having a higher stray capacitance. This can lead to the remarkable speed-up in comparison with the simple inverter having no switching MOS Tr. $T_1$. On the other hand, the MOS Tr. $T_2$ is a pull-up device for preventing the potential at the node $N_2$ from being excessively lowered.

Figure 4:
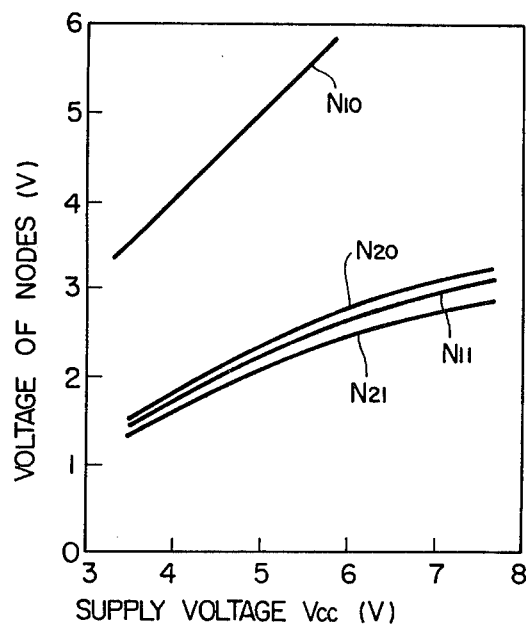
FIG. 4 is a graph illustrating the dependencies of the respective node voltages of the circuit shown in FIG. 3 upon the supply voltage $V_{cc}$.

As has been described with reference to FIG. 3, the read-out circuit of FIG. 3 has such characteristics as are suitable for the ROM LSI but has its maximum drawback that it is weak for the fluctuations in the supply voltage. More specifically, if the supply voltage $V_{cc}$ is raised to a higher level than 5 V, the potentials at all the nodes of the sense amplifier are also raised so that the potentials (at the both "1" and "0" levels) at the output node $N_1$ of the sense amplifier are also raised. As a result, if the voltage $V_{cc}$ becomes higher than a preset level, the inverter circuit of the output buffer 32 at the next step becomes inoperative thereby to cause an erroneous operation. These phenomena are illustrated in FIG. 4. In FIG. 4: reference letter $N_{10}$ indicates the change in the "0" level voltage at the node $N_1$; letter $N_{11}$ indicates the change in the "1" level voltage at the node $N_1$; letter $N_{20}$ indicates the change in the "0" level voltage at the node $N_2$; and letter $N_{21}$ indicates the change in the "1" level voltage at the node $N_2$. In case the design is so made that the inverter circuit at the next step operates without fail at $V_{cc}=5$ V, it is considerably difficult that the operation is ensured for the voltage $V_{cc}$ exceeding 7 V.

The present invention will now be described in detail in connection with the embodiments thereof.

Figure 5:
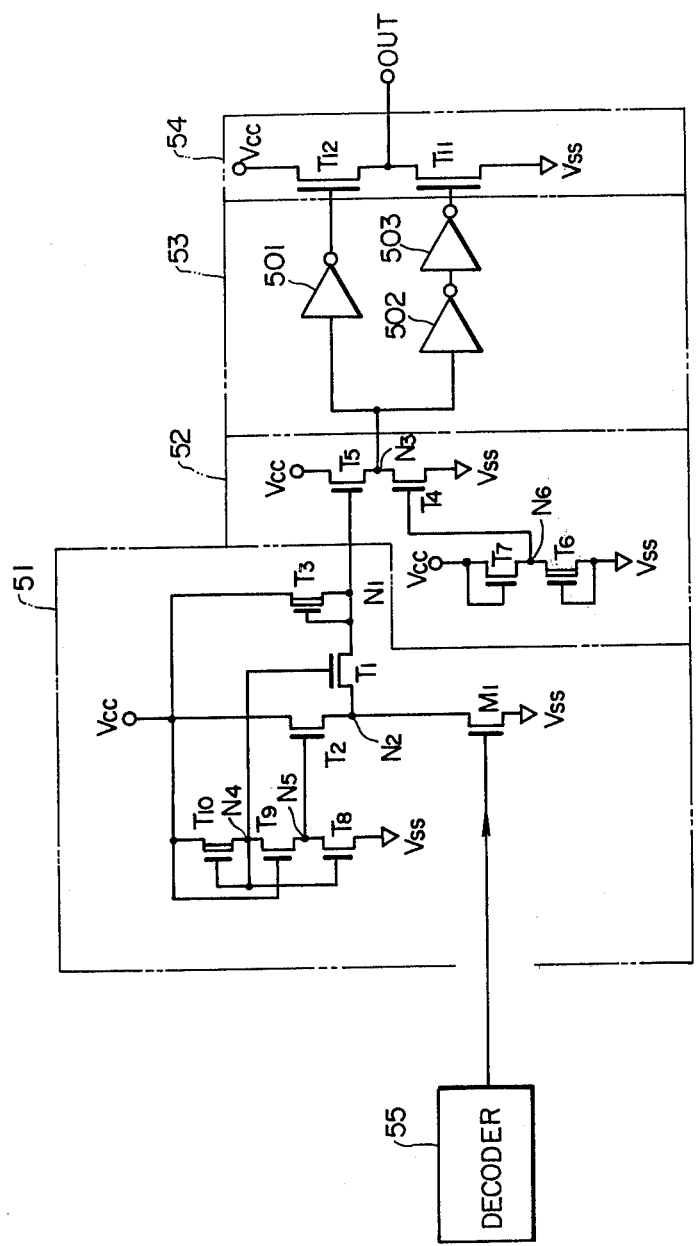
FIG. 5 is a simplified circuit diagram showing an embodiment of a ROM read-out circuit according to the present invention.

A read-out circuit for the ROMs exemplifying the present invention is shown in FIG. 5.

The ROM read-out circuit according to the present invention is basically composed of the following four units: a sense amplifier 51; a level shift circuit 52 for shifting the level of the signal voltage to be generated by the sense amplifier; a waveform restoring circuit 53; and a driver circuit 54. The three units of the level shift circuit 52, the waveform restoring circuit 53 and the driver circuit 54 can be deemed as an output buffer.

In FIG. 5: reference letters $T_1$, $T_2$, $T_4$, $T_5$, $T_7$, $T_8$, $T_9$, $T_{11}$ and $T_{12}$ indicate N channel type enhancement mode MOS Trs.; letters $T_3$, $T_6$ and $T_{10}$ indicate N channel type depletion mode MOS Trs.; letters $V_{cc}$ indicate the terminal to which the reading supply voltage is applied; letters $V_{ss}$ indicate a ground input terminal; letters OUT indicate an output terminal; letter $M_1$ indicate an element (such as the MNOS Tr. or FAMOS Tr. of N channel type); and numeral 55 indicates a decoder.

First of all, the level shifter (or level shift circuit) 52 will be described in the following. Since it is difficult to amplify (or restore the waveform of) the output of the sense amplifier 51 because this output fluctuates between 5 V and 2.4 V, that level shifter 52 has a conversion function to lower the level. The signal after the level shift can be amplified and waveform-restored merely through the inverter circuit. The level shifter is composed of a usual source follower (having MOS Trs. $T_4$ and $T_5$), as shown in the Figures by way of example only. By means of the circuit composed of the MOS Trs. $T_6$ and $T_7$, the load transistor $T_4$ of the source follower has its gate supplied with a voltage varying with the supply voltage thereby to impart a supply voltage dependence to an effective load resistance so that a stabilized source follower can be manufactured. In the circuit according to the present invention, under the normal operating condition with the supply voltage at 5 V, the output level (having a signal voltage swing of 5 V to 2.4 V) of the sense amplifier is lowered by about 2 V and converted into a signal having a voltage swing of 2.2 V to 0.4 V so that the inverter circuits 501, 502 and 503 of the next waveform restoring circuit 53 can be amplified. Even with the fluctuations in the supply voltage, the output voltage of the source follower is substantially invariable to realize the stable operations.

As a result, the the waveform restoring circuit merely has the inverter circuits arranged.

The driver circuit 54 is a driver circuit which is composed of the MOS Trs. $T_{11}$ and $T_{12}$ in a similar manner to a usual memory while using a push-pull amplifier.

The stabilization of the sense amplifier will be described in the following.

According to the present embodiment, as shown in FIG. 5, the gate voltages of the transistors $T_1$ and $T_2$ are controlled by a constant voltage generation circuit which is composed of the MOS Trs. $T_8$, $T_9$ and $T_{10}$. The output voltages ($N_4$ and $N_5$) of the constant voltage generation circuit have substantially no dependency upon the changes in the supply voltage $V_{cc}$, which are larger than 5 V, and are held at a constant level so that the dependence of the output voltage of the sense amplifier upon the supply voltage is minimized to further stabilize the operations of the source follower at the next step.

Figure 6:
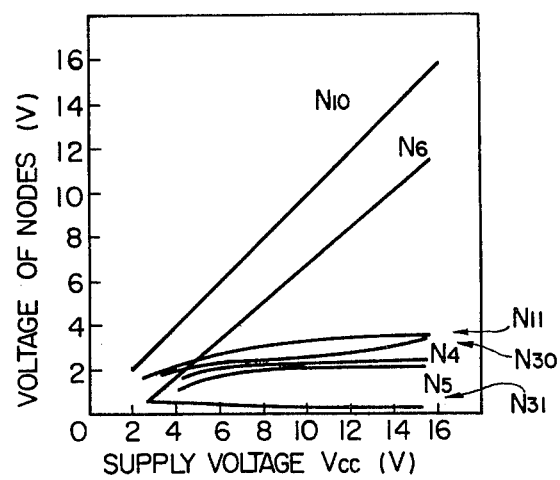
FIG. 6 is a graph illustrating the dependencies of the respective node voltage of the circuit shown in FIG. 5 upon the supply voltage $V_{cc}$.

The dependencies of the respective node voltages upon the supply voltage ($V_{cc}$) are illustrated in FIG. 6. In this Figure: letter $N_{10}$ indicates the "0" level voltage at the node $N_1$; letter $N_{11}$ indicates the "1" level voltage at the node $N_1$; letters $N_4$, $N_5$ and $N_6$ indicate the voltages at the nodes $N_4$, $N_5$ and $N_6$, respectively; letter $N_{30}$ indicates the "0" level voltage at the node $N_3$; and letter $N_{31}$ indicates the "1" level voltage at the node $N_3$. As is apparent from FIG. 6, the voltage of the output ($N_3$) of the level shifter is hardly dependent upon the supply voltage $V_{cc}$ so that the waveform restoring inverter circuit at the next step can be operated without fail.

Figure 7:
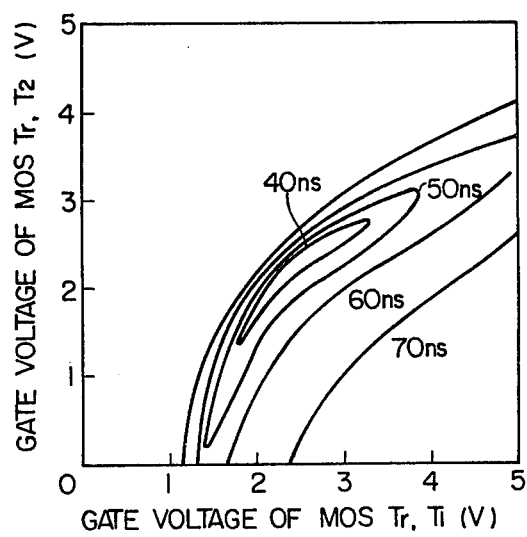
FIG. 7 is a contour chart illustrating the changes in the operating speed of the circuit shown in FIG. 5 relative to the gate voltages of MOS trs. $T_1$ and $T_2$.

As has been described hereinbefore, according to the present invention, the sense amplifier including the source follower can be stabilized as a whole in its operation during the fluctuations in the supply voltage so that the ROM read-out circuit having a wide margin of operation can be manufactured. In comparison with the circuit according to the prior art, the circuit according to the present invention has a spare circuit added thereto for the one step of the source follower. However, it is well known that the source follower circuit has such a low input impedance as to have little delay time. As a result, the circuit of the present invention has its operation speed prevented from being delayed more than the circuit shown in FIG. 3. The circuit of the present invention can rather enjoy the higher operation speed than the circuit of the prior art by presetting the gate voltages of the transistors $T_1$ and $T_2$ of the sense amplifier at the most proper levels. FIG. 7 illustrates the results, which are plotted in contours from the changes in the operation speed of the present sense amplifier such that the gate voltage of the transistor $T_1$ is taken along the abscissa whereas the gate voltage of the transistor $T_2$ is taken along the ordinate. From the Figure, it is found that the gate voltages of the transistors $T_1$ and $T_2$ can be the most properly preset at about 2.5 V while making a difference of about 0.3 V inbetween and that the circuit of the present invention can be raised in its operation speed by a level higher than 20 ns in comparison with the conventional circuit (in which the transistors $T_1$ and $T_2$ are held at the same gate voltage).

Figure 8A:
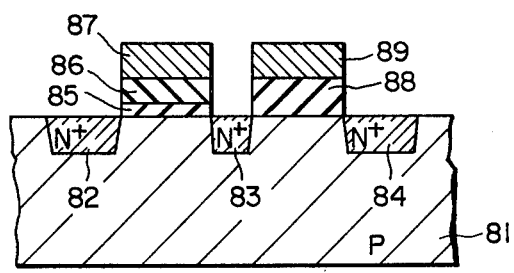
FIGS. 8A and 8B are a sectional view showing a memory cell, which is composed of the MNOS Tr. and MOS Tr., and a graph illustrating the transmission characteristics of the MNOS Tr., respectively.
Figure 8B:
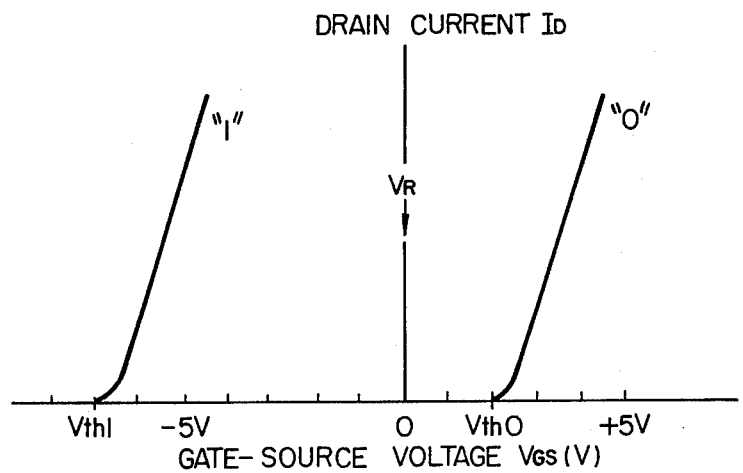

The following description is directed to another embodiment in which the read-out circuit according to the present invention is applied to such an EAROM of the type shown in FIG. 8A as has been disclosed in a Japanese Laid-Open Patent Publication No. 54-57875 laid open on May 5, 1979 corresponding to the pending U.S. patent application Ser. No. 949,244 and as has its memory cell composed of a memory element (MNOS Tr.) and a switching element (MOS Tr.). Here, let it be assumed that the MNOS Tr. to be used is an N channel element and that, as illustrated by the transfer characteristics of FIG. 8B, the threshold voltage is changed by about +2 V($V_{tho}$) by impressing the writing voltage (higher than +20 V) upon the gate electrode whereas the threshold voltage is changed by about −7 V ($V_{thl}$) by impressing the erasing voltage (higher than −20 V) upon the gate electrode. As a result, if the gate electrode of the MNOS Tr. is preset at the ground potential, the reading operation of the stored information can be effected by rendering the switching MOS Tr. conductive and nonconductive. In other words, the reading voltage applied to the gate electrode of the MNOS Tr. is at 0 V.

In the Figure: numeral 81 indicates an Si body of P-type conductivity; numerals 82, 83 and 84 indicate impurity regions of N+-type conductivity; numeral 85 indicates a remarkably thin $SiO_2$ layer; numeral 86 indicates an $Si_3N_4$; numeral 88 indicates a gate insulating layer; and numerals 87 and 89 indicate gate electrodes made of polycrystalline silicon (polu Si).

Figure 9:
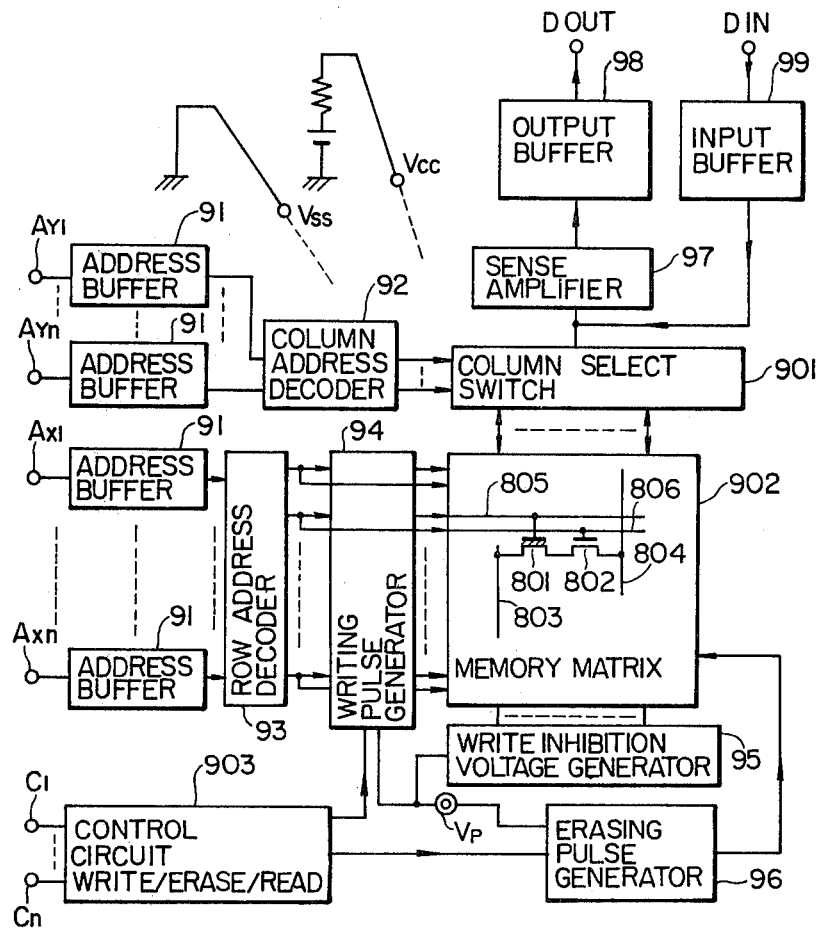
FIG. 9 is a block diagram showing an EAROM using the memory cell shown in FIG. 8A.

FIG. 9 shows a block diagram of the EAROM circuit which uses the memory cell of FIG. 8A (composed of: an MNOS Tr. 801; a switching MOS Tr. 802; a bit line connected with a write inhibition voltage generator 803; a data line 804; a writing word line 805; and an addressing word line 806). The pins are divided into the following five kinds:
(1): (Three) Power Supply Input Pins
   $V_{ss}$: Ground Potential Terminal;
   $V_{cc}$: Power Supply Input Terminal for supplying all the circuits with the supply voltage (e.g., +5 V);
   $V_p$: Programming Voltage (i.e., Write or Erase Voltage, e.g., +25 V) Supply Terminal;
   Incidentally, the circuit can be exemplified in accordance with its system by a single power supply system in which all the circuits are operated by a programming power supply.
(2) Address Input Pins $A_{xl}$ to $A_{xn}$ and $A_{yl}$ to $A_{yn}$: Terminals at which an addressing signal for designating the address of a memory matrix and the number of which is dependent upon the size of the matrix:
(3) Data Output Pin DOUT: Terminals for generating data in reading mode;
(4) Data Input Pin DIN: Terminals at which data are received;
   Incidentally, the pins (3) and (4) can be replaced by a common pin as in most cases.
(5) Mode Control Input Pin $C_l$ to $C_n$: Terminals for feeding such a mode control signal to a selective control circuit 903 as can control the chip under any of the three modes, i.e., the reading, writing and erasing modes.

The control function such as the chip select may be added, if necessary. The number of the pins is dependent upon the number of the control functions.

First of all, the reading operation will be described. In the reading mode, one of the switching transistors 802 is selected by means of an address buffer 91, a column address decoder 92 and a row address decoder 93. In this meanwhile, a writing pulse generator 94, a write inhibition voltage generator 95 and an erasing pulse generator 96 are left inoperative so that the outputs of the respective pulse voltage generators 94, 95 and 96 are grounded to the earth. In this state, whether or not any current flows through the memory cell selected is detected and generated as the data through a column select switch 901 and a sense amplifier 97.

In the writing mode, the address buffer 91 and the decoders 92 and 93 are operated in a similar manner to that in the reading mode. The write pulse generator 94 receives the signal from the decoder 93 so that the writing voltage pulses (e.g., those having the writing voltage of +25 V and the pulse length of 100 μs) at the high voltage $V_p$ are generated on the gate line 805 of the one MNOS Tr. selected. Then, the write inhibition voltage generator (or storage holding voltage generator) 95 supplies the N+-type impurity regions of all the MNOS Trs. of the memory cell with a write inhibition voltage (or storage holding voltage) $V_i$ (e.g., +20 V) which is slightly lower than the programming voltage $V_p$. In case the writing mode is designated by the data input signal (for example, for the input signal of "0"), the data line of the memory cell selected is lowered to the ground potential because it is derived of its current by the input buffer. As a result, the writing operation of the memory cell selected is accomplished. Since, in the case of the data input at the level "1", the input buffer extracts no current, the memory cell selected is also supplied with the write inhibition voltage so that the writing operation is not effected.

In the erasing mode, all the decoders 92 and 93, the write pulse generator 94 and the write inhibition voltage generator 95 are left inoperative so that the erasing voltage pulses at a level $V_E$ (having an erasing voltage of +25 V and a pulse length of 10 ms, for example) are generated by the erasing pulse generator 96 and impressed upon a memory well (or a well diffused region in which the memory cells are provided) or the semiconductor body. As a result, all the bits are erased together.

If an erasing function is desired for each word line, it is sufficient that the decoder 93 and the write pulse generator 94 are operated inversely of the writing operation and that only the memory gate line 805 selected is grounded to the earth while all the other memory gate lines being supplied with the same voltage $V_E$ as that of the well.

Figure 10:
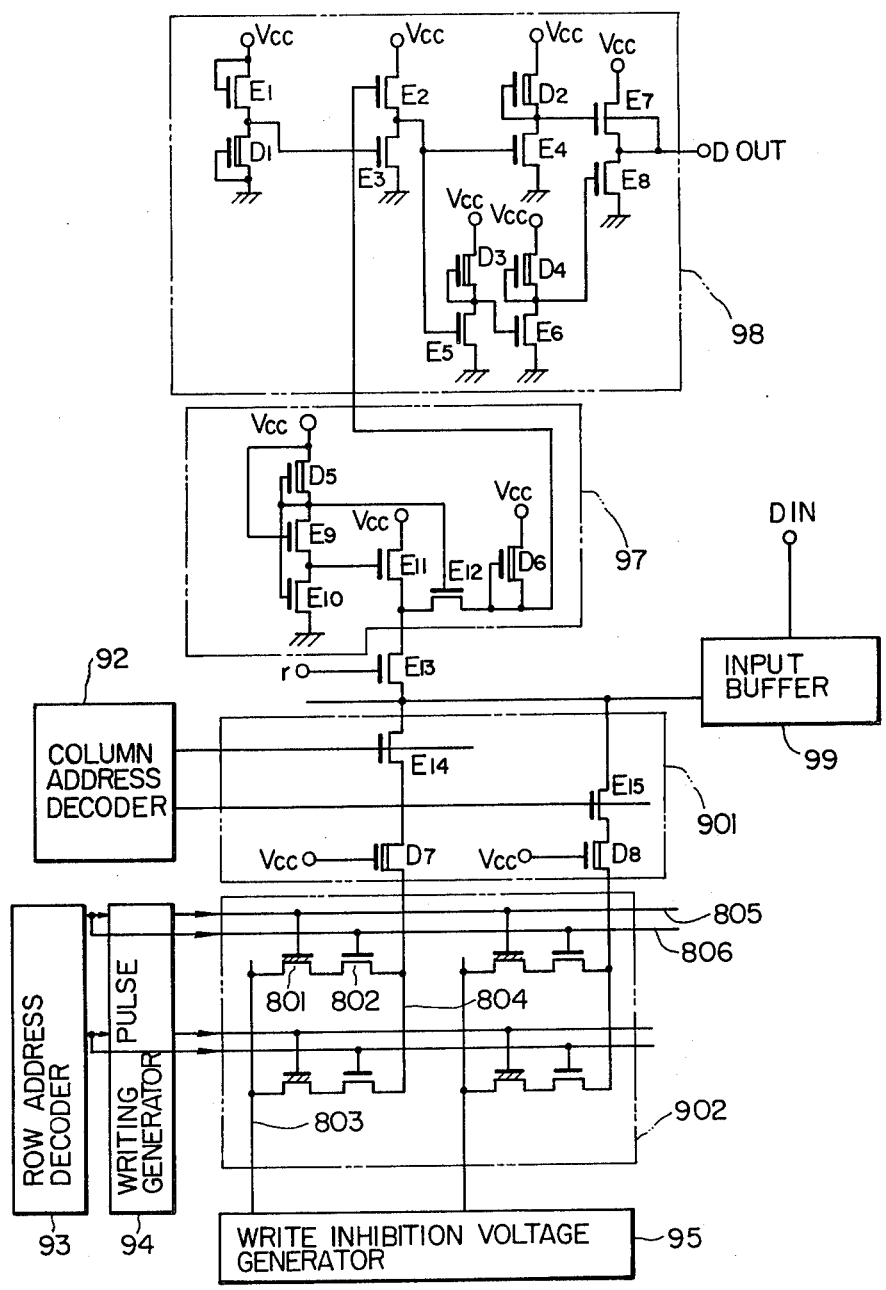
FIG. 10 is a circuit diagram showing an essential portion thereof in case the present invention is applied to the circuit shown in FIG. 9.

FIG. 10 shows an example, in which the read-out circuit according to the present invention is applied to the EAROM shown in FIG. 9. In FIG. 10: letters $E_1$ to $E_{15}$ indicate N channel type enhancement mode MOS Trs.; letters $D_1$ to $D_8$ indicate N channel depletion mode MOS Trs.; and letter $E_{13}$ indicates a switching element (or element) which is made responsive to a writing signal r for separating the memory matrix and the sense amplifier. Moreover, the output driver circuit push-pull driver is so designed that no substrate bias effect results by providing the load MOS Tr. $E_7$ in the P-type well diffused region separated from the other circuits (provided that the N-type Si body is used to provide the memory matrix and the peripheral circuits in the respective P-type wells thereby to constitute the LSI structure). Thus, the present invention can enjoy the following effects: (1) the rise time of the signal is shortened; and (2) the high level of the output signal is raised.

The symbols used in FIGS. 3 to 10 will be summarized in the following:

$T_1$, $T_2$, $T_4$, $T_5$, $T_7$, $T_8$, $T_9$, $T_{11}$ and $T_{12}$—Enhancement Mode MOS Trs.; $T_3$, $T_6$, $T_{10}$, and $D_1$ to $D_8$—Depletion Mode MOS Trs.; 51—Sense Amplifier; 52—Level Shifter; 53—Waveform Restoring Circuit; 54—Driver Circuit; 55—Decoder; $M_1$—Memory Cell; 81—P-Type Si Body; 82, 83 and 84—N-Type Diffusion Regions; 85—$Si_3N_4$ Layer; 86—$SiO_2$ Layer; 87—Gate Electrode of MNOS Tr.; 88—$SiO_2$ Layer; 89—Gate Electrode of MOS Tr. (or Switching Transistor); 801—MNOS Tr.; 806—Addressing Word Line (or Row Address Line for Read-out and Write); 805—Writing Word Line (or Writing Voltage Impressing Line); 803—Common Line (or Bit Line Connected with Write Inhibition Voltage Generator); 802—MOS Tr.; 91—Address Buffer; 92—Y Decoder (or Column Address Decoder); 94—Writing Pulse Generator; 95—Write Inhibition Voltage Generator (or Storage Holding Voltage Generator); 96—Erasing Pulse Generator; 97—Sense Amplifier; 98—Output Buffer; 99—Input Buffer; 901—Y Switch (Column Select Switch); 902—Memory Matrix; and 903—Control Circuit (or Write, Erasure and Read-out Selecting Circuit).

What is claimed is:

1. A nonvolatile semiconductor memory comprising a memory matrix including a plurality of memory cells having nonvolatile memory elements and arranged in the form of a matrix, means for selecting a desired memory cell from said memory matrix, and a read-out circuit for reading out the information stored in the selected memory cell, said read-out circuit including a sense amplifier and an output buffer, said sense amplifier including an inverter having a load element to which a supply voltage is applied and a selected memory cell acting as a driver element, said output buffer including a level shift circuit for shifting the level of an output signal voltage from said sense amplifier, said level shift circuit including means for stabilizing the level of the shifted signal voltage during fluctuations in said supply voltage, and an output driver circuit for receiving the shifted signal voltage from said level shift circuit.

2. A nonvolatile semiconductor memory as set forth in claim 1, wherein said level shift circuit is a source follower circuit having its load resistance varied in accordance with the fluctuations in said supply voltage.

3. A nonvolatile semiconductor memory as set forth in claim 2, wherein said source follower circuit load resistance includes an MOS Tr. and said stabilizing means includes means for impressing a gate voltage upon the gate of said MOS Tr. which varies with the fluctuations in said supply voltage.

4. A nonvolatile semiconductor memory as set forth in claim 1, wherein said inverter includes a switching MOS Tr. connected between an MOS Tr. acting as said load element and said memory cell acting as said driver element, and wherein said switching MOS Tr. is brought into its cut-off state when its connection node with said memory cell is raised in its potential to a preset level.

5. A nonvolatile semiconductor memory as set forth in claim 4, further comprising a pull-up MOS Tr. connected between said connection node and a power source terminal.

6. A nonvolatile semiconductor memory as set forth in claim 5, wherein said switching MOS Tr. and said pull-up MOS Tr. have their gate voltages controlled by a constant voltage generating circuit.

7. A nonvolatile semiconductor memory as set forth in claim 6, wherein said switching MOS Tr. has its gate voltage preset by said constant voltage generating circuit so that it becomes higher than the gate voltage of said pull-up MOS Tr.

8. A nonvolatile semiconductor memory as set forth in claim 1, wherein said level shift circuit includes a source follower circuit and said output driver circuit is connected to an output of said source follower circuit.

9. A nonvolatile semiconductor comprising: a memory matrix including a plurality of memory cells having nonvolatile memory elements and arranged in the form of a matrix; means for selecting a preset memory cell from said memory matrix; and a read-out circuit for reading out the information stored in the selected memory cell, said read-out circuit including a sense amplifier and an output buffer, wherein the improvement resides in that said output buffer includes a level shift circuit for shifting the level of the output signal voltage from said sense amplifier and an output driver circuit for receiving the output signal from said level shift circuit, said output driver circuit including a waveform restoring circuit and a push-pull driver circuit.

* * * * *